United States Patent
Choi et al.

(10) Patent No.: US 7,354,823 B2
(45) Date of Patent: Apr. 8, 2008

(54) METHODS OF FORMING INTEGRATED CIRCUIT DEVICES HAVING CARBON NANOTUBE ELECTRODES THEREIN

(75) Inventors: Young-Moon Choi, Seoul (KR); In-Seok Yeo, Seoul (KR); Sun-Woo Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 2 days.

(21) Appl. No.: 11/205,253

(22) Filed: Aug. 16, 2005

(65) Prior Publication Data

US 2006/0157771 A1   Jul. 20, 2006

(30) Foreign Application Priority Data

Sep. 8, 2004  (KR) .................. 10-2004-0071892

(51) Int. Cl.
*H01L 21/8242* (2006.01)
(52) U.S. Cl. .................. 438/244; 257/E21.012
(58) Field of Classification Search ........ 438/244; 257/E21.012
See application file for complete search history.

(56) References Cited

U.S. PATENT DOCUMENTS 6,842,328 B2   1/2005  Schott et al.

2003/0100189 A1   5/2003  Lee et al.

FOREIGN PATENT DOCUMENTS

| KR | 1020020040645 A | 5/2002 |
|---|---|---|
| KR | 1020030043176 A | 6/2003 |
| KR | 1020030081567 A | 10/2003 |
| KR | 1020040069492 A | 8/2004 |
| WO | WO 01/61753 A1 | 8/2001 |

OTHER PUBLICATIONS

English translation of KR 1020040069492 A by Schreiber Translations Inc.*
Korean Office Action, Korean Application No. 10-2004-0071892, Jun. 29, 2006.

* cited by examiner

*Primary Examiner*—Lex Malsawma
(74) *Attorney, Agent, or Firm*—Myers Bigel Sibley & Sajovec

(57) ABSTRACT

An integrated circuit capacitor includes first and second electrodes and at least one dielectric layer extending between the first and second electrodes. The first electrode includes at least one carbon nanotube. The capacitor further includes an electrically conductive catalyst material. This catalyst material may be selected from the group consisting of iron, nickel and cobalt and alloys thereof.

8 Claims, 10 Drawing Sheets

US 7,354,823 B2

METHODS OF FORMING INTEGRATED CIRCUIT DEVICES HAVING CARBON NANOTUBE ELECTRODES THEREIN

REFERENCE TO PRIORITY APPLICATION

This application claims priority to Korean Application Serial No. 2004-71892, filed Sep. 8, 2004, the disclosure of which is hereby incorporated herein by reference.

FIELD OF THE INVENTION

The present invention relates to integrated circuit devices and methods of forming integrated circuit devices and, more particularly, to integrated circuit devices having on-chip capacitors and methods of forming integrated circuit devices having on-chip capacitors.

BACKGROUND OF THE INVENTION

A carbon nanotube (CNT) has a tube structure in which carbon atoms are combined with others in a form of a hexagonal lattice. The carbon nanotube may have a diameter of several nanometers. The carbon nanotube may be known as a defect-free material having superior mechanical strength, high electrical selectivity, excellent field-emission performance, and efficient hydrogen storage capability. The carbon nanotube is usually manufactured by high synthesis technologies such as arc discharge, pyrolysis, laser deposition, plasma enhanced chemical vapor deposition, thermal chemical vapor deposition, electrolysis, and flame synthesis.

Efforts to use the aforementioned properties of the carbon nanotube have been made in a variety of fields. For example, U.S. patent Publication No. 2003/0100189 A1 discloses a method of forming a catalyst metal on a substrate and growing a carbon nanotube thereon. At least one problem with the method disclosed in this document is that it is difficult to obtain a carbon nanotube vertically oriented against the substrate.

SUMMARY OF THE INVENTION

Embodiments of the invention include a semiconductor memory device having a cell transistor formed on a semiconductor substrate and having a source region, a drain region, and a word line traversing an upper portion of a channel region provided between the source region and the drain region. A bit line is electrically connected to the drain region of the cell transistor via a bit line contact plug. A storage region is electrically connected to the source region via a buried contact plug. The storage region includes a carbon nanotube.

Additional embodiments of the invention include methods of manufacturing a semiconductor memory device. These methods include forming a cell transistor on a semiconductor substrate. The cell transistor includes a source region, a drain region, and a word line traversing an upper portion of a channel region provided between the source region and the drain region. An insulating layer is also formed on the substrate. A buried contact plug is formed in the insulating layer. The buried contact plug is electrically connected to the drain region. A lower electrode having a carbon nanotube is formed on the buried contact plug. A step is then performed to form a storage dielectric layer on a surface of the lower electrode. An upper capacitor electrode is then formed on the storage dielectric layer.

Still further embodiments of the invention include an integrated circuit device having an integrated circuit capacitor therein. This integrated circuit capacitor includes first and second electrodes and at least one dielectric layer extending between the first and second electrodes. The first electrode includes at least two carbon nanotubes and an electrically conductive diffusion layer in gaps between the at least two carbon nanotubes. The integrated circuit device further includes a semiconductor substrate and an electrically conductive plug. This conductive plug electrically connects the first electrode to the semiconductor substrate. The capacitor further includes an electrically conductive catalyst material. This electrically conductive catalyst material extends between the electrically conductive plug and the at least two carbon nanotubes. This catalyst material may be selected from the group consisting of iron, nickel and cobalt and alloys thereof. The conductive plug may also include a material selected from the group consisting of tungsten, titanium, tantalum and polysilicon.

DETAILED DESCRIPTION OF THE INVENTION

Figure 1:
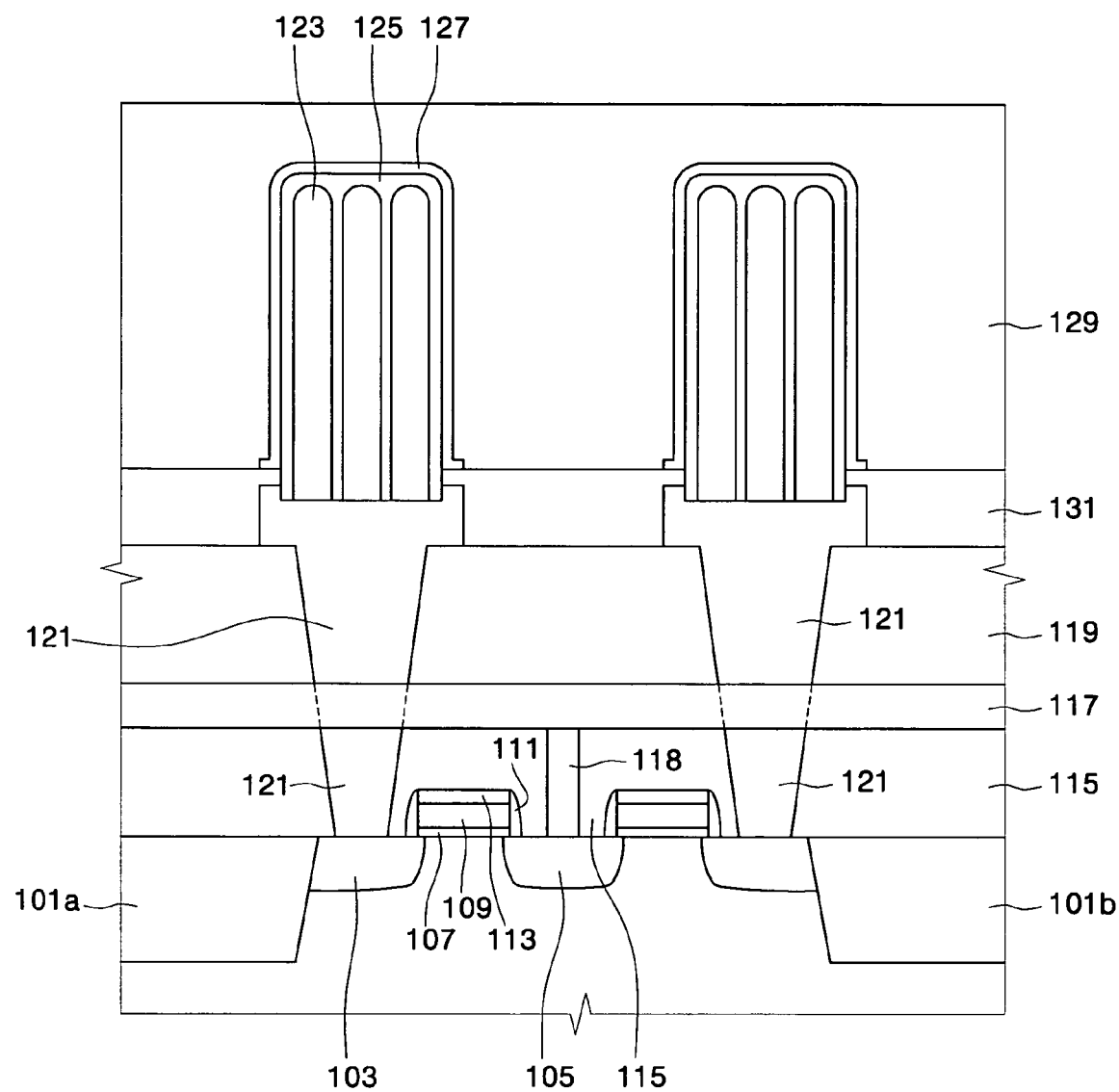
FIG. 1 is a cross-sectional view of an integrated circuit memory device according to embodiments of the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present. Moreover, each embodiment described and illustrated herein includes its complementary conductivity type embodiment as well.

FIG. 1 is a cross-sectional view illustrating a semiconductor memory device according to a first embodiment of the present invention. Referring to FIG. 1, an active region is defined by trenches 101a, 101b formed by shallow trench isolation. A gate is formed on the active region, and a source 103 and a drain 105 are formed in the active region. The source 103 and the drain 105 may be formed by a typical ion implantation process using the gate as an implant. Also, the gate includes a gate oxide film 107 and conduction material 109. Preferably, the gate oxide film 107 is made of $SiO_2$, and the conduction material 109 is made of poly-silicon. The gate may be provided with a sidewall spacer 111 and a hard mask layer 113, which protect the poly-silicon of the gate during subsequent etching processes and doping with a high concentration of ions into the source and drain regions.

A transistor is defined by the source 103, the drain 105, and the gate provided on the active region. Furthermore, a first interlayer insulating layer 115 covering the transistor is formed thereon. The upper surface of the first insulating interlayer 115 is provided with a bit line 117, which is electrically connected to the drain 105 via a bit line contact plug 118. Preferably, the bit line 117 is provided with a conductor for electrical connection with the bit line contact plug 118 and a bit line spacer for protecting the conductor.

On the upper surface of the bit line 117, a second interlayer insulating layer 119 is provided to fully cover the bit line 117. Subsequently, a buried contact plug 121 is provided by a self-aligned contact process. The self-aligned contact process is a technique that makes it possible to form bit lines and word lines, and then form contact holes by using the bit lines and the word lines as an etching mask. In case the contact holes are filled with a conductive material, plugs are formed and they can be electrically connected to the source or the drain of the active region located under the interlayer insulating layers.

On the buried contact plug 121 formed by the self-aligned contact process, a lower electrode 123 is formed. The lower electrode 123 has at least one carbon nanotube therein. More specifically, the lower electrode 123 may be made of only one carbon nanotube or two or more carbon nanotubes.

If the lower electrode 123 has two or more carbon nanotubes, a diffusion barrier 125 may be formed to fill the gaps between the carbon nanotubes, and to prevent oxygen atoms contained in a dielectric material from being diffused into the lower electrode 123 and to facilitate a bonding between the lower electrode 123 and the dielectric film. The diffusion barrier 125 may be made of a predetermined conductive material by chemical vapor deposition or atomic layer deposition. Specifically, on the surface of the diffusion barrier 125, a dielectric film 127 is provided. In addition, an upper electrode 129 is formed on the surface of the dielectric film 127. An etching protection layer 131 is also provided under the upper electrode 129. The etching protection layer 131 protects the second insulating interlayer 119 during an etching process for forming the upper electrode 129. If the lower electrode 123 has only one carbon nanotube, a dielectric film may be provided on the surface of the carbon nanotube, and an upper electrode may be provided on the surface of the dielectric film. Alternatively, the diffusion barrier is provided on the surface of the carbon nanotube, and the upper electrode is provided on the diffusion barrier.

Figure 2A:
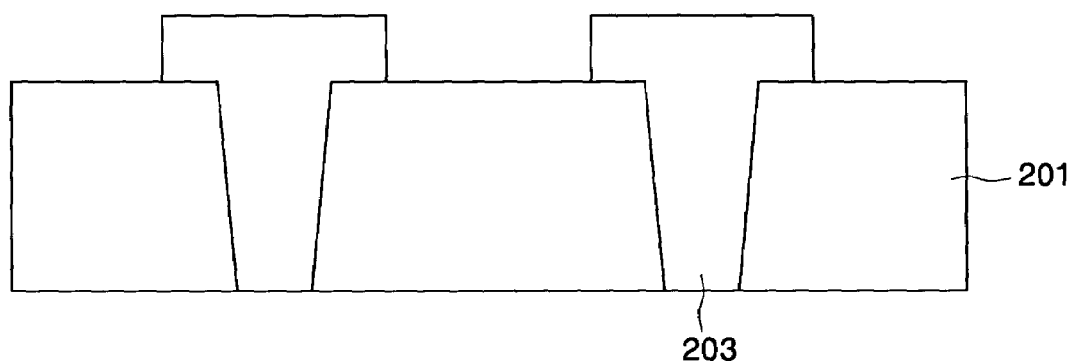
FIGS. 2A-2G are cross-sectional views of intermediate structures that illustrate methods of forming integrated circuit memory devices having carbon nanotube electrodes, according to embodiments of the present invention.

FIGS. 2A through 2G are cross-sectional views illustrating a method of manufacturing a semiconductor memory device having a single carbon nanotube as a lower capacitor electrode, according to a second embodiment of the present invention. Referring to FIG. 2A, a buried contact plug 203 is formed on a semiconductor substrate having a cell transistor, a first interlayer insulating layer (not shown) covering the cell transistor, a bit line (not shown) formed on the first interlayer insulating layer, and a second interlayer insulating layer 201 covering the bit line.

A buried contact hole is formed in the second interlayer insulating layer 201. The buried contact hole may be formed by depositing a photoresist layer (not shown) on the second interlayer insulating layer 201 and then patterning the photoresist layer by a photolithography process. By the patterning process, predetermined portions of the second interlayer insulating layer 201 are exposed. Then, anisotropic dry etching is applied to the exposed portions of the second interlayer insulating layer 201 to define opening therein. Subsequently, anisotropic dry etching is applied to the first interlayer insulating layer disposed underneath the second insulating interlayer 201 to thereby expose a source region of a cell transistor. (See also FIG. 1, which shows a first interlayer insulating layer 115 and a second interlayer insulating layer 119 having a contact hole extending therethrough). Alternatively, a landing pad (not shown) made of poly-silicon may be provided on the source region of the cell transistor, and the aforementioned anisotropic dry etching may be applied to expose the landing pad. As in the first embodiment, the buried contact hole may be formed by a self-aligned contact process.

The buried contact hole formed by the anisotropic dry etching is then filled with a conductive material, which is patterned to define a buried contact plug 203. The conductive material may be selected from a group consisting of W, Ti, Ta and poly-silicon. Preferably, the buried contact plug 203 is made of tungsten (W) due to its good step coverage. Also, the buried contact plug 203 may be formed by filling the buried contact hole and extending it to the upper surface of the second interlayer insulating layer 201. If the buried contact plug 203 is made of poly-silicon, silicide (not shown) may be provided by depositing Ni or Co metal on the buried contact plug 203 and then performing heat treatment to convert the metal to a metal silicide.

Figure 2B:
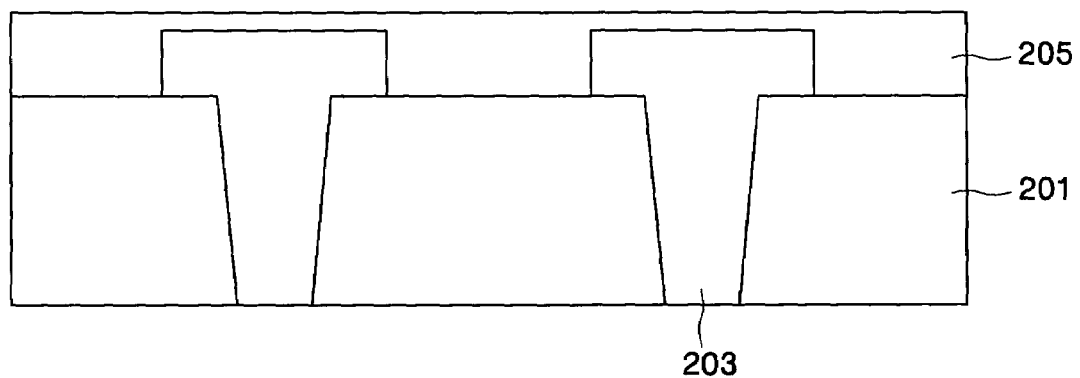
Figure 2C:
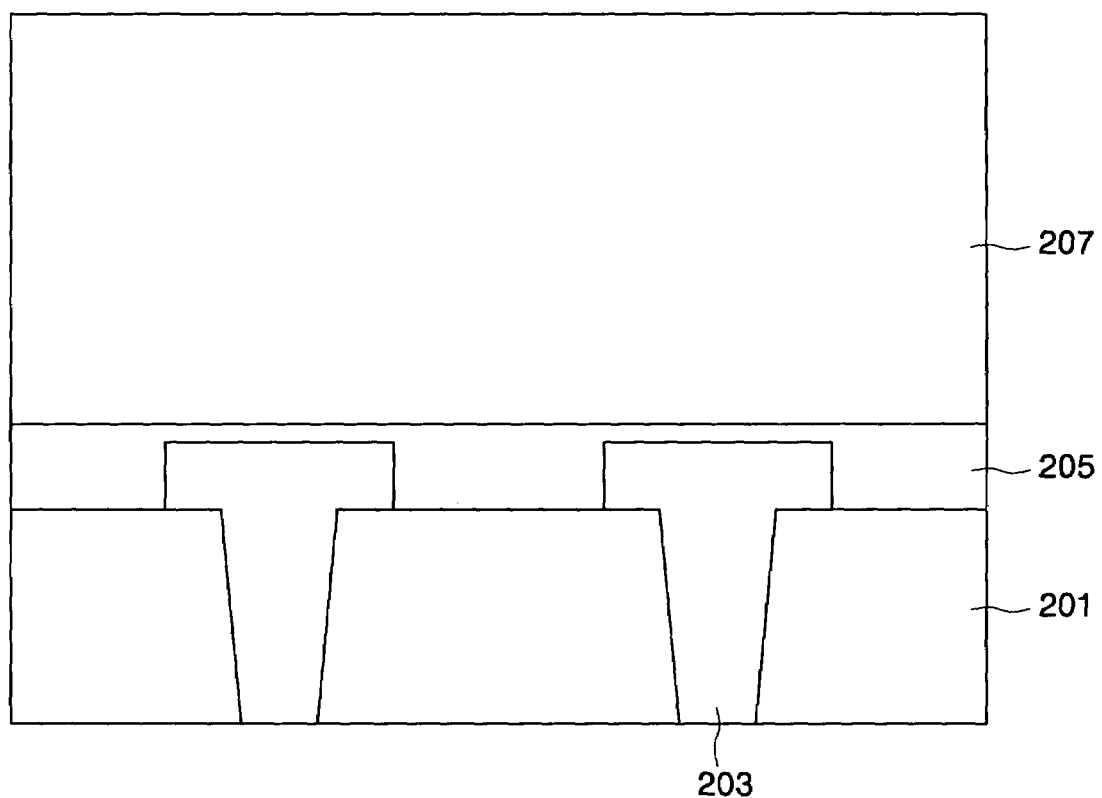

Referring to FIG. 2B, an etching protection layer 205 is formed to fully cover the buried contact plug 203. Preferably, the etching protection layer 205 is made of SiN. The etching protection layer 205 may be formed to fully cover the buried contact plug 203 and the second interlayer insulating layer 201. Referring to FIG. 2C, a third interlayer insulating layer 207 is provided on the etching protection layer 205. The third interlayer insulating layer 207 is made of an insulation material, and may be formed using a chemical vapor deposition (CVD) technique.

Figure 2D:
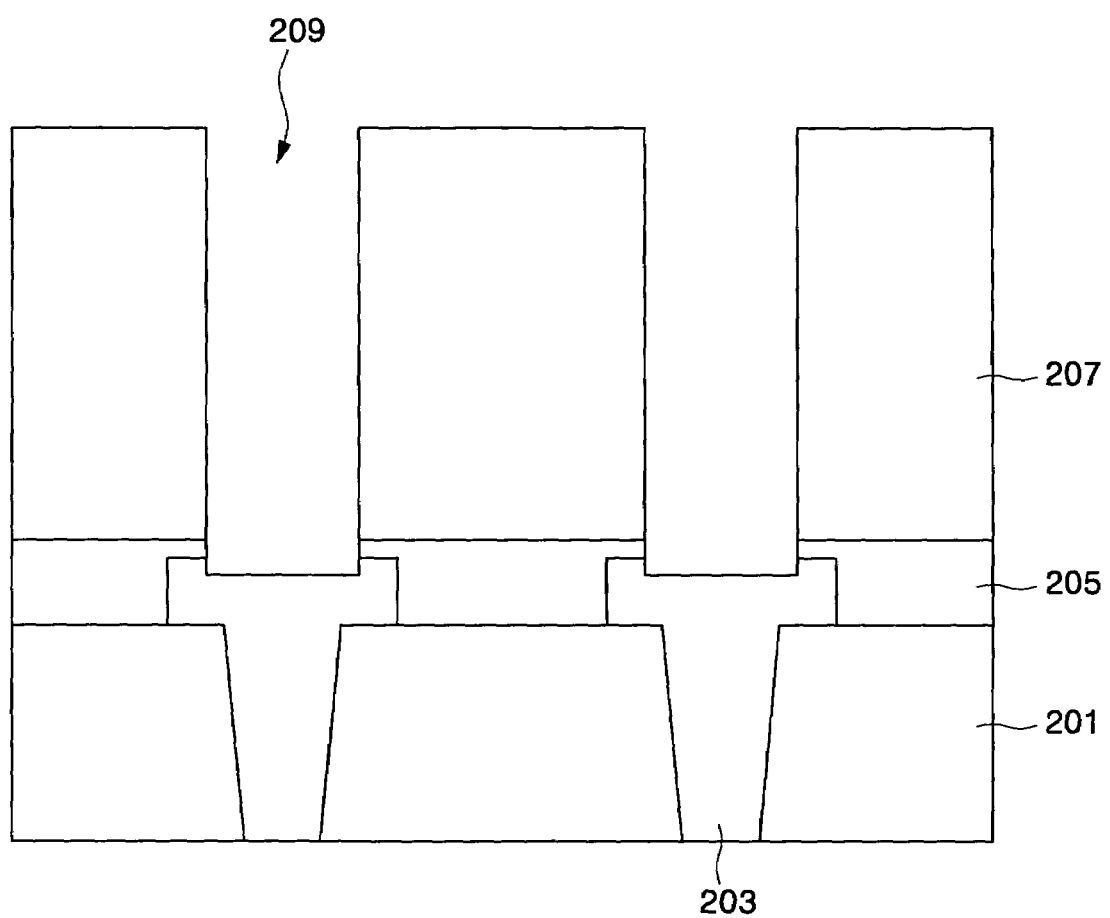

Referring to FIG. 2D, the third interlayer insulating layer 207 and the etching protection layer 205 are selectively etched in sequence to expose the buried contact plugs 203. First, a photoresist layer (not shown) is deposited on the surface of the third interlayer insulating layer 207 and patterned by a typical photolithography process to define a photoresist pattern (not shown). This patterning allows predetermined portions of the third interlayer insulating layer 207 to be exposed. Then, an anisotropic dry etching is applied to remove the exposed portions and expose the buried contact plug 203. The etched space is used as a guide pattern 209 for growing a carbon nanotube, as described hereinbelow.

Figure 2E:
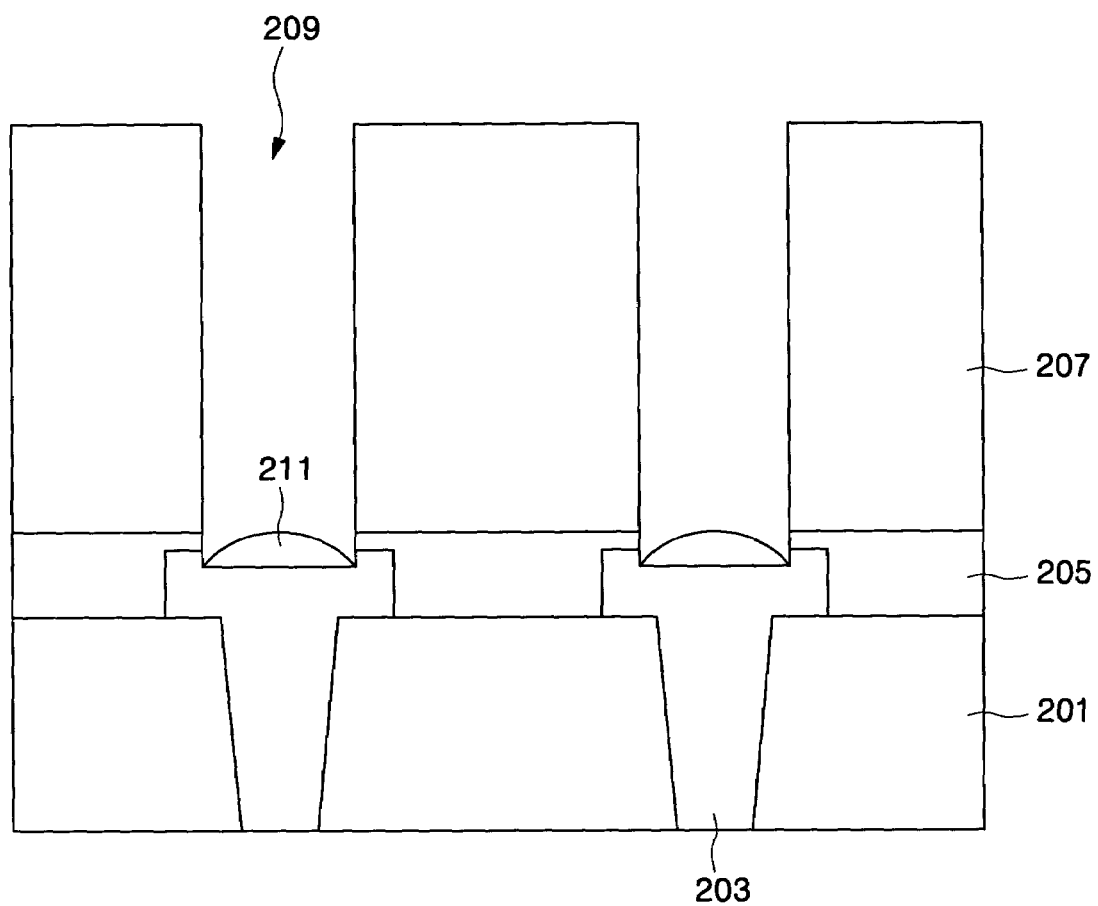

Referring to FIG. 2E, a catalyst metal particle 211 for growing a carbon nanotube is provided on each buried contact plug 203. The catalyst metal particle 211 may be made of a material selected from a group consisting of Fe, Ni, Co and alloys thereof. The catalyst metal material is first deposited on the buried contact plug 203. In particular, the catalyst metal material is deposited on the buried contact plug 203, which is at a bottom surface of the guide pattern 209 for growing a carbon nanotube, sidewalls of the guide pattern 209, and on the photoresist pattern (not shown). Subsequently, the photoresist pattern and the catalyst metal material deposited on the photoresist pattern are removed by chemical mechanical polishing (CMP) to expose the third interlayer insulating layer 207. After CMP, the deposited catalyst metal material remains only in the guide pattern 209.

Then, an etching process is performed to provide a catalyst metal particle 211 in each guide pattern 209. Preferably, the etching process may be a wet etching process using an HF aqueous solution. More specifically, the substrate on which the catalyst metal material is deposited can be dipped into the HF aqueous solution for several tens or hundreds seconds to perform a wet etching for the surface of the catalyst metal material. The dipping time may be appropriately controlled depending on the number and the sizes of the catalyst metal particles that will be formed. The dipping time necessary to form one catalyst metal particle 211 in the guide pattern 209 maybe 10 through 200 seconds.

After the wet etching using the HF aqueous solution, dry etching using an NH3 gas may be performed for the directional growth of the carbon nanotube. The wet etching using the HF aqueous solution can provide the catalyst metal particle 211. However, its surface may be rough. Therefore, an NH3 gas is supplied to the substrate and guide patterns 209 with a predetermined flux for several tens of minutes to obtain the catalyst metal particle 211 having a smooth hemispherical shape. By performing wet etching using the HF aqueous solution and/or the dry etching using an NH3 gas, it is possible to remove the catalyst metal materials formed on the side-walls of the guide patterns 209.

Figure 2F:
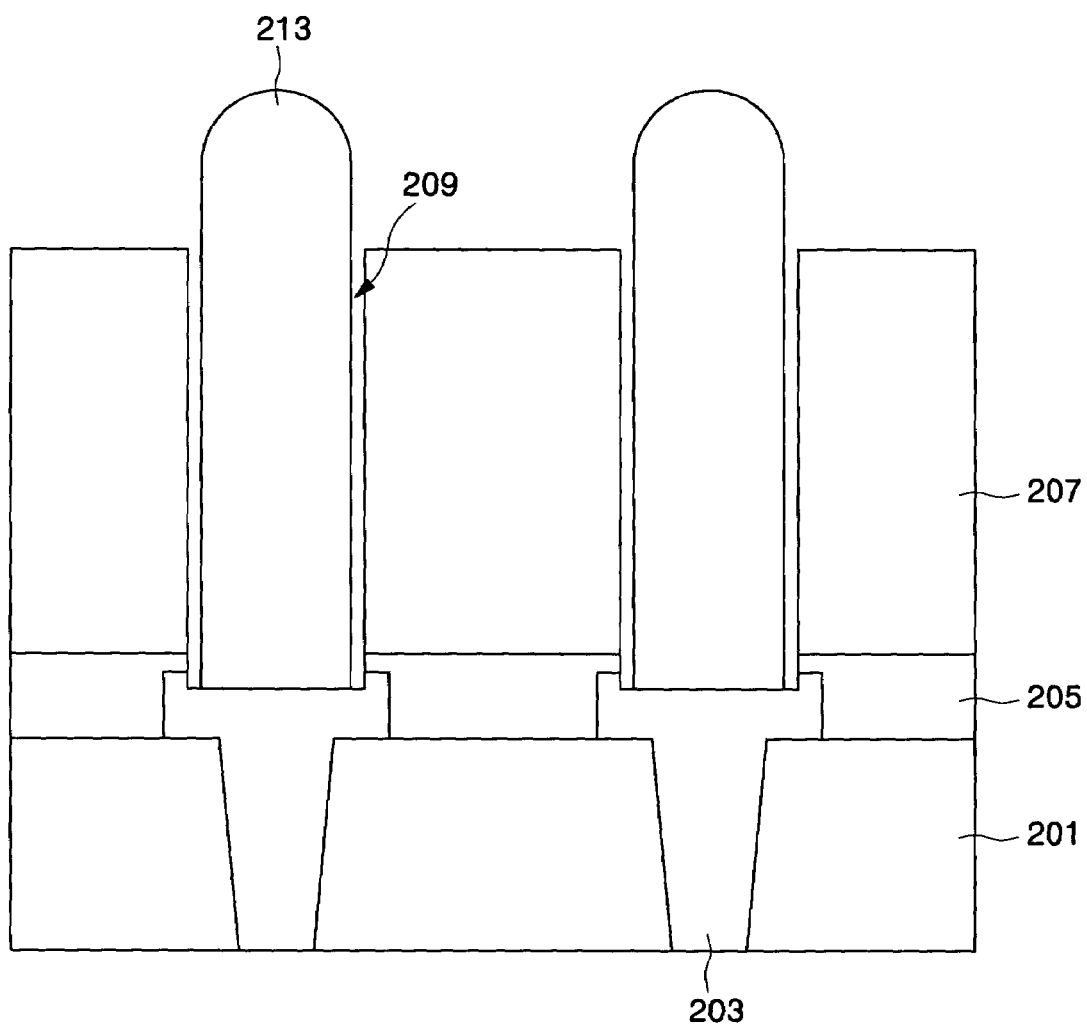

Referring to FIG. 2F, the catalyst metal particle 211 in each guide pattern 209 is used to grow a carbon nanotube 213, which will be used for a lower capacitor electrode of a storage capacitor. While the carbon nanotube 213 grows, the guide pattern 209 allows the carbon nanotube to grow in a vertical direction. The growth of the carbon nanotube 213 may be performed by plasma enhanced chemical vapor deposition (PECVD) or thermal chemical vapor deposition. PECVD is a method of performing glow discharge of reactive gases by using direct currents or high frequency electric fields applied between two electrodes. The semiconductor substrate for synthesizing each carbon nanotube 213 may be positioned on the lower electrode that is grounded, and the reactive gases are supplied to the upper electrode. The reactive gas may include $CH_4$, $C_2H_2$, or $C_2H_4$. Preferably, the temperature for synthesizing the carbon nanotube 213 is within a range of 700° C. through 950° C. In contrast, thermal chemical vapor deposition is a method of growing the carbon nanotube 213 by locating the semiconductor substrate in a reactor chamber and supplying the reactive gases within a predetermined temperature range into the inside of the reactor chamber. Preferably, the reaction temperature may be within a range of 500° C. through 950° C., and the reactive gas may include a carbonized gas such as $C_2H_2$, $CH_4$, $C_2H_4$, or CO.

Figure 2G:
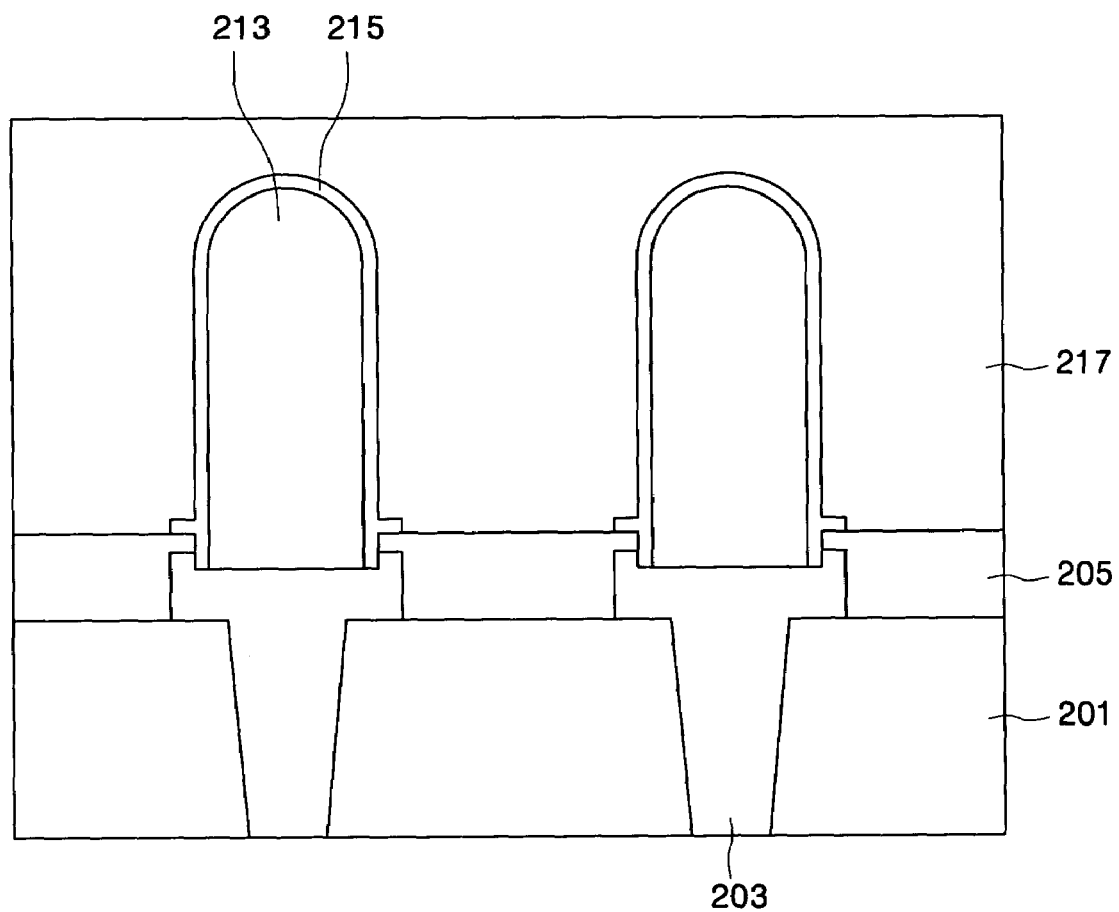

Referring to FIG. 2G, the third interlayer insulating layer 207 is removed after the carbon nanotube 213 forming the storage lower electrode is synthesized. Preferably, the third interlayer insulating layer 207 may be removed by a wet etching process in which the etching protection layer 205 is used as an etching mask. After removal of the third interlayer insulating layer 207, the carbon nanotube 213 formed on the buried contact plug 203 and the etching protection layer 205 formed between the buried contact plugs are exposed. Subsequently, a dielectric film 215 is provided on the surface of the carbon nanotube 213. Alternatively, a diffusion barrier (not shown) may be formed on the surface of the carbon nanotube 213 before the dielectric film 215 is formed. The diffusion barrier prevents oxygen contained in the dielectric material from being diffused into the carbon nanotube 213, and facilitates a bonding between the dielectric film 215 and the carbon nanotube 213, which acts as a lower capacitor electrode. The diffusion barrier may be made of TiN.

The entire surface of the etching protection layer 205 and the dielectric film 215 are covered with a conducting material to form an upper capacitor electrode 217. As a result, it is possible to provide a semiconductor memory device having a carbon nanotube 213 that operates as a capacitor electrode with a memory cell. Alternatively, the method of growing the carbon nanotube 213 using the guide pattern 209 may be modified. More specifically, a process of removing a portion of the carbon nanotube protruding from the third interlayer insulating layer 207 (see FIG. 2F), may be added after the carbon nanotube 213 having a predetermined length is synthesized. The length of the carbon nanotube 217 can be controlled by chemical mechanical polishing. Processes of depositing the dielectric film 213 and forming the upper electrode 207 after controlling the length of the carbon nanotube 213 are then performed as described herein above.

Figure 3A:
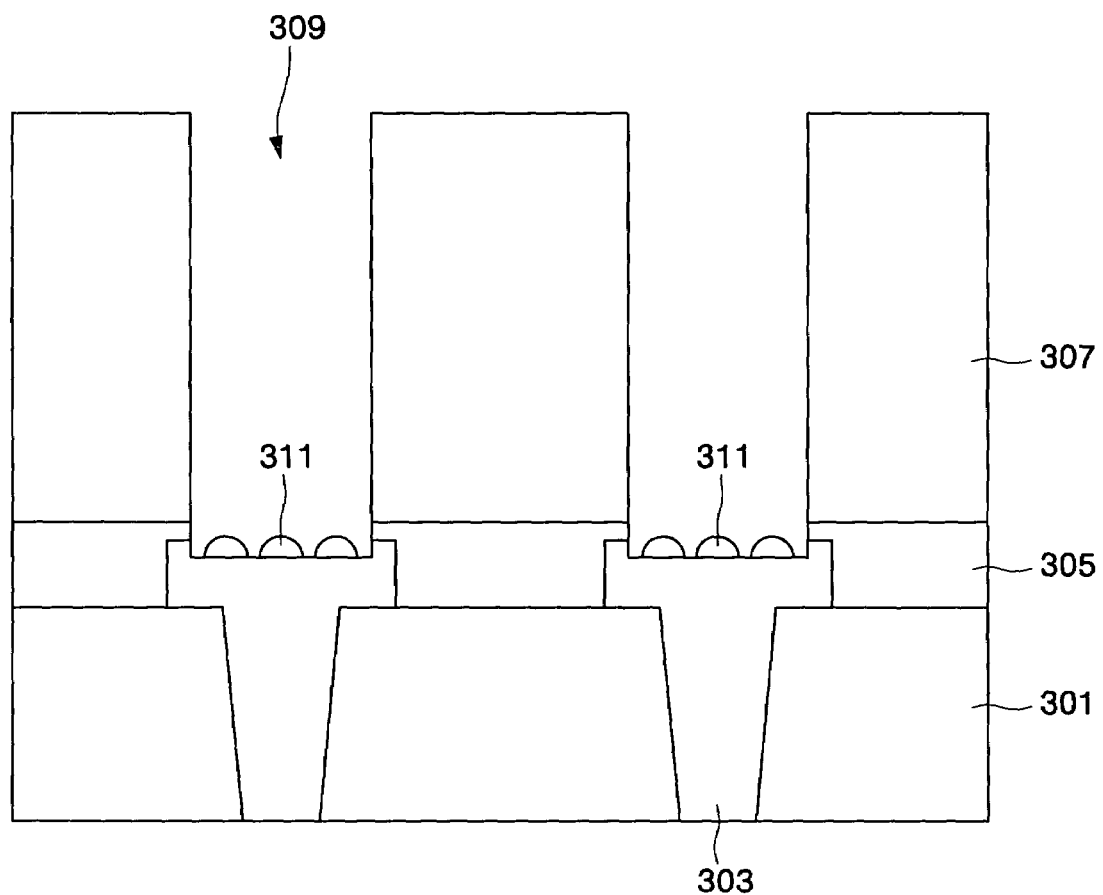
FIGS. 3A-3C are cross-sectional views of intermediate structures that illustrate methods of forming integrated circuit memory devices according to embodiments of the present invention.
Figure 3B:
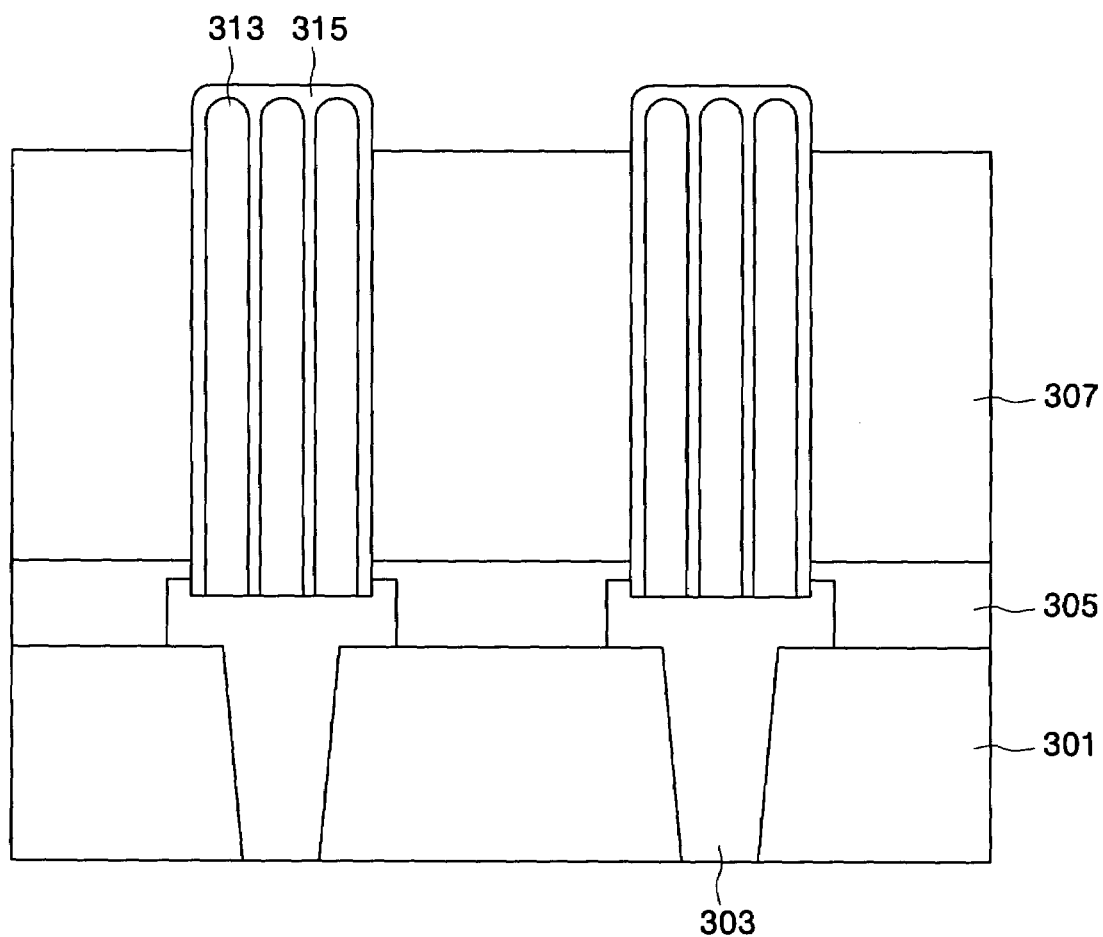
Figure 3C:
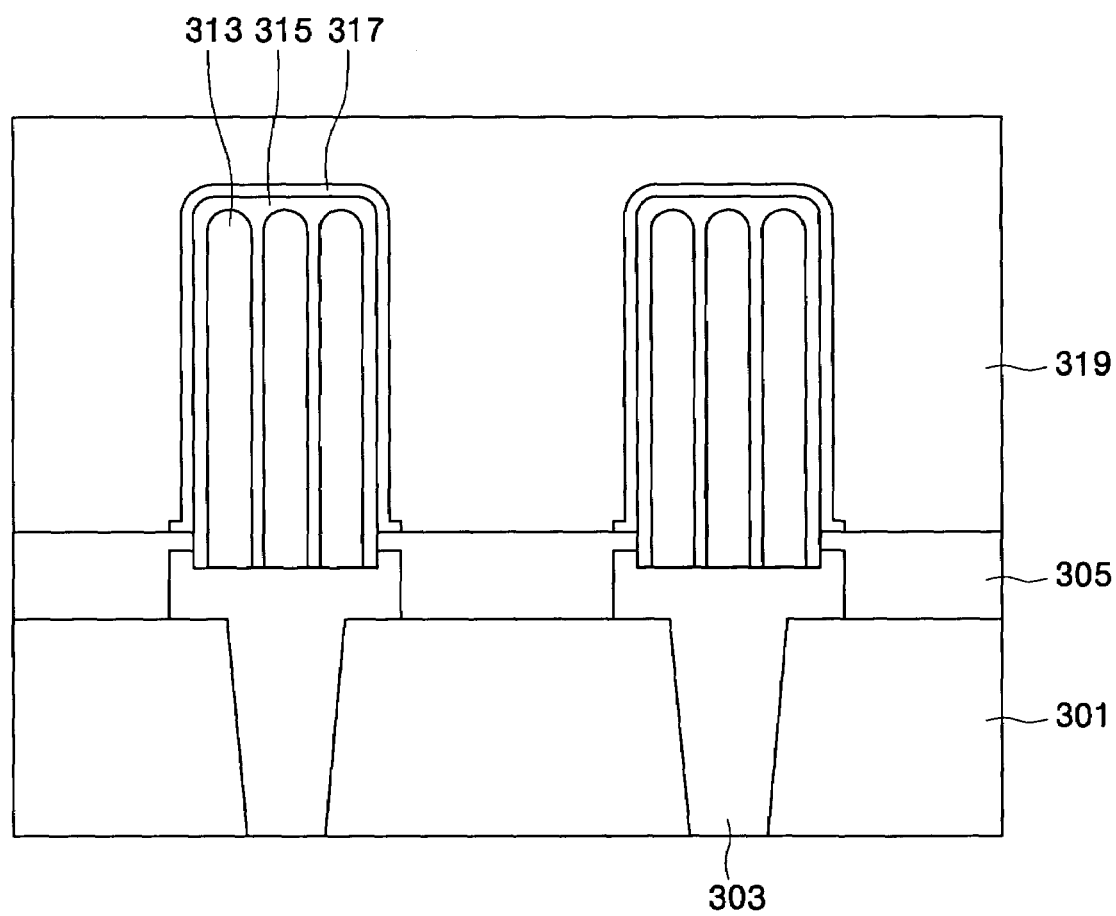

FIGS. 3A through 3C are cross-sectional views for describing a method of manufacturing a semiconductor memory device shown in FIG. 1 according to another embodiment of the present invention. Referring to FIG. 3A, two or more catalyst metal particles 311 are provided within each guide pattern 309 that is formed on a semiconductor substrate. Since processes of forming the guide pattern 309 for growing a carbon nanotube are similar to those shown in FIGS. 2A through 2D, their detailed description will not be provided again. First, a catalyst metal material is deposited on the buried contact plug 303 formed in the guide pattern 309. The catalyst metal material may be selected from a group consisting of Fe, Ni, Co and alloys thereof. Then, an etching process for forming catalyst metal particles 311 is performed. Preferably, the etching process may be a wet etching process using an HF aqueous solution. More specifically, a semiconductor substrate on which the catalyst metal material is deposited is dipped into the HF aqueous solution for several tens or hundreds seconds to perform a wet etching of the surface of the catalyst metal material. The dipping time may be appropriately controlled according to the number and the sizes of the catalyst metal particles that will be formed. As shown in FIG. 3A, the dipping time necessary to form two or more catalyst metal particles 311 in the guide pattern 309 may be 10 through 200 seconds.

After the wet etching using the HF aqueous solution, a dry etching using an NH3 gas may be performed for the directional growth of the carbon nanotubes. The wet etching using the HF aqueous solution can provide catalyst metal particles 311. However, their surfaces may be rough. To remedy this roughness, an NH3 gas is supplied to the semiconductor substrate with a predetermined flux for at least several minutes to obtain a plurality of catalyst metal particles 311 having smooth hemispherical shapes.

Referring to FIG. 3B, the catalyst metal particles in the guide pattern 309 are used to grow carbon nanotubes 313 for a lower capacitor electrode. While the carbon nanotubes 313 grow, the guide pattern 309 is used to allow the carbon nanotubes 313 to grow in a vertical direction. The growth of the carbon nanotubes 313 is performed by plasma enhanced chemical vapor deposition (PECVD) or thermal chemical vapor deposition. Among a plurality of carbon nanotubes 313, van der waal's forces and steric hindrance are present. For this reason, the vertically oriented carbon nanotubes 313 are separated from each other. The minimum interval between the separated carbon nanotubes 313 is about 0.34 nm. Subsequently, the space between the separated carbon nanotubes 313 and the space between sidewalls of the guide pattern 309 are filled with a conductive material. The conductive material may function as a diffusion barrier 315. The diffusion barrier 315 prevents oxygen contained in a dielectric film from being diffused into the carbon nanotubes 313, and facilitates a bonding between the dielectric film and the carbon nanotubes 313 corresponding to the lower electrode. The diffusion barrier 315 may be made of TiN.

Referring to FIG. 3C, the surface of the diffusion barrier 315 is covered with a dielectric film 317, and the upper electrode 319 is provided on the dielectric film 317. More specifically, the third interlayer insulating layer 307 can be removed by wet etching. As a result, the diffusion barrier 315, the etching protection layer 305, and the lower electrode having the carbon nanotubes 313 are exposed. Then, the dielectric film 317 is deposited on the exposed diffusion barrier 315. Subsequently, the upper capacitor electrode 319 is provided to fully cover the surfaces of the deposited dielectric film 317 and the etching protection layer 305. As a result, it is possible to provide a semiconductor memory device having carbon nanotubes 313 that form capacitor electrodes.

Alternatively, the method of growing the carbon nanotubes 313 using the guide pattern 309 may be differently embodied. More specifically, a process of removing portions of the carbon nanotubes 313 protruding from the third interlayer insulating layer may be added after the carbon nanotubes of a predetermined length are synthesized. The length of the carbon nanotubes 313 can be controlled by chemical mechanical polishing. Processes for depositing the dielectric film 315 and forming the upper capacitor electrode after controlling the length of the carbon nanotubes 313 are similar to those of the aforementioned embodiment.

Thus, as described herein, guide patterns are used to induce the directional growth of carbon nanotubes, and catalyst metal particles are used to support formation of a lower capacitor electrode of a semiconductor memory device. As a result, it is possible to obtain a semiconductor memory device having a carbon nanotube used as a lower capacitor electrode. The carbon nanotube has a cylindrical shape with a high aspect ratio. Therefore, it is possible to obtain a storage capacitor having high capacitance. Since a work function of the carbon nanotube is typically 4.7 through 5.0 eV, it is possible to reduce leakage currents that can occur between the lower capacitor electrode and the dielectric film. Furthermore, since the carbon nanotube has a π bonding structure which is chemically stable, it provides tolerance of chemical influences in subsequent fabrication processes and excellent stability for heat flux.

While the present invention has been particularly shown and described with reference to exemplary embodiments thereof, it will be understood by those skilled in the art that various changes in form and details may be made therein without departing from the spirit and scope of the invention as defined by the appended claims. The exemplary embodiments should be considered in descriptive sense only and not for purposes of limitation. Therefore, the scope of the invention is defined not by the detailed description of the invention but by the appended claims, and all differences within the scope will be construed as being included in the present invention.

What is claimed is:

1. A method of forming an integrated circuit device, comprising the steps of:
    forming an interlayer insulating layer having a guide opening therein;
    forming at least one carbon nanotube electrode in the guide opening;
    removing the interlayer insulating layer to expose the at least one carbon nanotube electrode;
    forming a capacitor dielectric layer on the at least one carbon nanotube electrode; and
    forming an upper capacitor electrode that is separated from the at least one carbon nanotube electrode by the capacitor dielectric layer.

2. The method of claim 1, wherein said step of forming at least one carbon nanotube electrode comprises depositing the at least one carbon nanotube electrode in the guide opening using a plasma-enhanced chemical vapor deposition technique.

3. The method of claim 2, wherein the plasma-enhanced chemical vapor deposition technique includes forming a plasma from a reactive gas selected from the group consisting of C2H2, CH4 and C2H4.

4. The method of claim 2, wherein said step of forming at least one carbon nanotube electrode comprises depositing the at least one carbon nanotube electrode at a temperature in a range from about 700° C. to about 950° C.

5. The method of claim 2, wherein said step of forming at least one carbon nanotube electrode comprises depositing the at least one carbon nanotube electrode on a catalyst metal particle comprising a material selected from the group consisting of iron, nickel and cobalt and alloys thereof.

6. The method of claim 1, wherein said step of forming at least one carbon nanotube electrode comprises depositing the at least one carbon nanotube electrode in the guide opening using a chemical vapor deposition technique and a reactive gas selected from the group consisting of C2H2, CH4, C2H4 and CO.

7. A method of forming a dynamic random access memory device, comprising the steps of:
    forming an access transistor having source and drain regions, adjacent a surface of semiconductor substrate;
    forming a buried contact plug electrically connected to one of the source and drain regions, on the semiconductor substrate;
    forming an interlayer insulating layer having a guide opening therein that exposes the buried contact plug;
    forming a lower capacitor electrode comprising at least one carbon nanotube, on an exposed portion of the buried contact plug;
    removing the interlayer insulating layer to expose the lower capacitor electrode; then
    forming a capacitor dielectric layer on the lower capacitor electrode; and
    forming an upper capacitor electrode on the capacitor dielectric layer.

8. A method of forming a dynamic random access memory device, comprising the steps of:
    forming an access transistor having source and drain regions, adjacent a surface of semiconductor substrate;
    forming a bit line electrically coupled to the drain region, on the semiconductor substrate;
    forming a buried contact plug electrically connected to the source region, on the semiconductor substrate;
    forming a lower capacitor electrode comprising at least one carbon nanotube, on the buried contact plug;
    forming a capacitor dielectric layer on the lower capacitor electrode; and
    forming an upper capacitor electrode on the capacitor dielectric layer;
    wherein said step of forming a capacitor dielectric layer is preceded by the step of removing an upper portion of the carbon nanotube using a chemical-mechanical planarization (CMP) technique; and wherein said step of forming a capacitor dielectric layer comprises forming a capacitor dielectric layer on a planarized surface of the carbon nanotube.

* * * * *